United States Patent
Benton et al.

(10) Patent No.: US 9,817,042 B2
(45) Date of Patent: Nov. 14, 2017

(54) FUEL DISPENSER TAMPER DETECTION ARRANGEMENT

(71) Applicant: Danaher UK Industries Limited, Sheffield (GB)

(72) Inventors: Geoffrey Alan Benton, Essex (GB); Michael Lawrence Jennings, Essex (GB)

(73) Assignee: Danaher UK Industries, Ltd., Sheffield (GB)

( * ) Notice: Subject to any disclaimer, the term of this patent is extended or adjusted under 35 U.S.C. 154(b) by 627 days.

(21) Appl. No.: 14/206,407

(22) Filed: Mar. 12, 2014

(65) Prior Publication Data

US 2014/0300372 A1    Oct. 9, 2014

Related U.S. Application Data

(60) Provisional application No. 61/782,432, filed on Mar. 14, 2013.

(51) Int. Cl.
| | |
|---|---|
| *G08B 21/00* | (2006.01) |
| *G05B 9/02* | (2006.01) |
| *G01R 19/165* | (2006.01) |
| *B67D 7/34* | (2010.01) |
| *B67D 7/04* | (2010.01) |

(52) U.S. Cl.
CPC .............. *G01R 19/165* (2013.01); *B67D 7/34* (2013.01); *B67D 7/04* (2013.01)

(58) Field of Classification Search
CPC .......... G01R 19/165; B67D 7/34; B67D 7/04
USPC .............................. 324/537; 340/637; 700/79
See application file for complete search history.

(56) References Cited

U.S. PATENT DOCUMENTS

| | | | |
|---|---|---|---|
| 5,447,062 A | 9/1995 | Kopl et al. | |
| 5,689,071 A | 11/1997 | Ruffner et al. | |
| 5,954,080 A | 9/1999 | Leatherman | |
| 6,067,476 A * | 5/2000 | Siler | B67D 7/08 340/637 |
| 6,109,477 A | 8/2000 | Myers et al. | |
| 6,123,092 A * | 9/2000 | Torii | F02M 51/061 137/1 |

(Continued)

FOREIGN PATENT DOCUMENTS

| | | |
|---|---|---|
| CN | 101500932 A | 8/2009 |
| EP | 1666406 A2 | 6/2006 |
| WO | 2008067507 A2 | 6/2008 |

OTHER PUBLICATIONS

International Search Report and Written Opinion dated Jul. 7, 2014 in corresponding PCT application No. PCT/EP2014/055095.

(Continued)

*Primary Examiner* — Farhana Hoque
(74) *Attorney, Agent, or Firm* — Nelson Mullins Riley & Scarborough, LLP

(57) ABSTRACT

Methods and systems provide for detecting tampering of a fuel dispenser. Power is applied to a valve coil of a fuel dispenser. The valve coil is part of a control valve configured to accomplish a gradated fuel flow of the fuel dispenser. Current flowing through the valve coil is measured in response to the power being applied to the valve coil. The current measurements are compared with predetermined criteria and tampering with the valve coil is determined if the current measurements are sufficiently different than expected.

18 Claims, 8 Drawing Sheets

(56) References Cited

U.S. PATENT DOCUMENTS

| | | |
|---|---|---|
| 6,250,151 B1 | 6/2001 | Tingleff et al. |
| 6,296,148 B1 | 10/2001 | Myers et al. |
| 6,397,686 B1 | 6/2002 | Taivalkoski et al. |
| 6,435,204 B2 | 8/2002 | White et al. |
| 7,111,520 B2 | 9/2006 | Payne et al. |
| 7,946,309 B2 | 5/2011 | Reid et al. |
| 8,096,446 B2 | 1/2012 | Carapelli |
| 8,285,506 B2 | 10/2012 | Oldham et al. |
| 2007/0267088 A1* | 11/2007 | Hughes ................ B67D 7/0476 141/59 |

OTHER PUBLICATIONS

Wikipedia web page print out of "File:Commercial Solenoid Dawes 1920.png" at http://en.wikipedia.org/wiki/File:Commercial_Solenoid_Dawes_1920.png, printed Feb. 20, 2013.

Office Action dated Nov. 28, 2016 in corresponding Chinese patent application No. 201480025913.7.

Second Office Action issued on Aug. 18, 2017 in corresponding Chinese patent application No. 201480025913.7, all inclosed pages cited.

Examination Report issued on Sep. 12, 2017 in corresponding European patent application No. 14711207.2, all inclosed pages cited.

* cited by examiner

FUEL DISPENSER TAMPER DETECTION ARRANGEMENT

PRIORITY CLAIM

The present application is based upon and claims the benefit of U.S. provisional application Ser. No. 61/782,432, filed Mar. 14, 2013, incorporated herein by reference in its entirety for all purposes.

FIELD OF THE INVENTION

Embodiments of the present invention relate generally to fuel dispensers. More specifically, embodiments of the present invention relate to detection and prevention of fraud caused by tampering with a proportional control value associated with a fuel dispenser.

BACKGROUND OF THE INVENTION

In a retail service station environment, the flow rate of fuel dispensed must be controlled for a variety of reasons and requirements. These include but are not limited to prevention of flow, an initial slow flow rate to verify various internal metrological subsystem functionalities, an unrestricted flow rate mode and/or mode limited to a maximum flow rate as specified by jurisdictional regulatory authorities, and a reduced flow rate prior to transaction completion to effect precise cessation at a predetermined volume or price.

Also, because the fuel has value, there is motive for theft and fraud to occur. For example, one mode of theft involves tampering with the dispenser's proportional control valve to induce the unauthorized flow of fuel. For example, a dishonest user may try to steal fuel by exposing an armature of the control valve and/or impartation of extraneous magnetic field thereto. There is also a need to have better information about the operational status of dispenser components for reasons such as maintenance.

Historically, variable flow rate is effectuated by the modulation of current within an actuating field coil (hereinafter "valve coil") of the proportional control valve. By modulating or applying current to the valve coil, a mechanical force is produced. This force causes the armature to move the valve into an open position.

However, present fuel dispensing systems that employ proportional control valves have certain limitations. Specifically, the aforementioned current is modulated under the presumption that the proportional valve is mechanically intact and functional, and that the valve outputs a proper mechanical force based on the number of windings in the coil to accomplish a gradated fuel flow. Moreover, the presumption likewise exists that the proportional control valve does not permit fuel flow when it does not receive control signals.

A dishonest user may steal fuel by tampering with the valve coil of a proportional control valve. For example, the dishonest user may remove the valve coil from the armature of the proportional control valve so that, even though control signals are not sent to the proportional control valve, an unauthorized flow of fuel is induced.

Consequently, the ability to mechanically tamper with the proportional valve to induce unauthorized flow exists without notice or validation by the controlling modulation mechanism, or more generally, the electronic controller commanding control of the valve.

SUMMARY

The present invention recognizes and addresses considerations of prior art constructions and methods.

According to one aspect, the present invention provides a fuel dispenser tamper detection arrangement comprising a valve coil, a power source, and a switch electrically connected in circuit with the valve coil and the power source. A current detector is configured to determine current flowing in the valve coil. An electronic controller is communicatively connected with the switch and the current detector. The electronic controller being configured to apply a first control signal to the switch to close the switch so that the power source applies power to the valve coil, receive measurements from the current detector of current flowing in the valve coil after the switch is closed, perform a comparison of data indicative of the current measurements against predetermined criteria, and based on the comparison, determine whether tampering has occurred.

Another aspect of the present invention provides a method for determining tampering of a fuel dispenser. The method comprises providing a switch electrically connected in circuit with a power source and a valve coil of a control valve of the fuel dispenser. A first control signal is applied to the switch to close the switch so that the power source applies power to the valve coil. Measurements are received from a current detector of current in the valve coil after the switch is closed. The method further involves comparing data indicative of the current measurements against predetermined criteria. It is determined whether tampering has occurred in response to the comparing step.

A still further aspect of the present invention provides a system for a fuel dispenser comprising a circuit arrangement including a valve coil. A power source is operative to supply power to the circuit arrangement. A detector is configured to determine an electrical parameter of the circuit arrangement indicative of tampering with the valve coil. The system further includes an electronic controller communicatively connected with the detector, the electronic controller being configured to receive a measurement from the detector based on a response in the circuit arrangement to power being supplied thereto, perform a comparison of data indicative of the measurements against predetermined criteria, and determine whether tampering has occurred based on the comparison.

According to another aspect, the present invention provides a method for detecting tampering of a fuel dispenser. The method comprises applying power to a valve coil of a fuel dispenser, wherein the valve coil is configured to control accomplish a gradated fuel flow of the fuel dispenser. Current flowing through the valve coil in response to the power being applied to the valve coil is measured and compared with predetermined criteria. The method further involves determining that the valve coil has been tampered with in response determining that the measured current is sufficiently different from the predetermined criteria.

Those skilled in the art will appreciate the scope of the present invention and realize additional aspects thereof after reading the following detailed description of preferred embodiments in association with the accompanying drawing figures.

BRIEF DESCRIPTION OF THE DRAWINGS

A full and enabling disclosure of the present invention, including the best mode thereof directed to one of ordinary skill in the art, is set forth in the specification, which makes reference to the appended drawings, in which.

Figure 1:
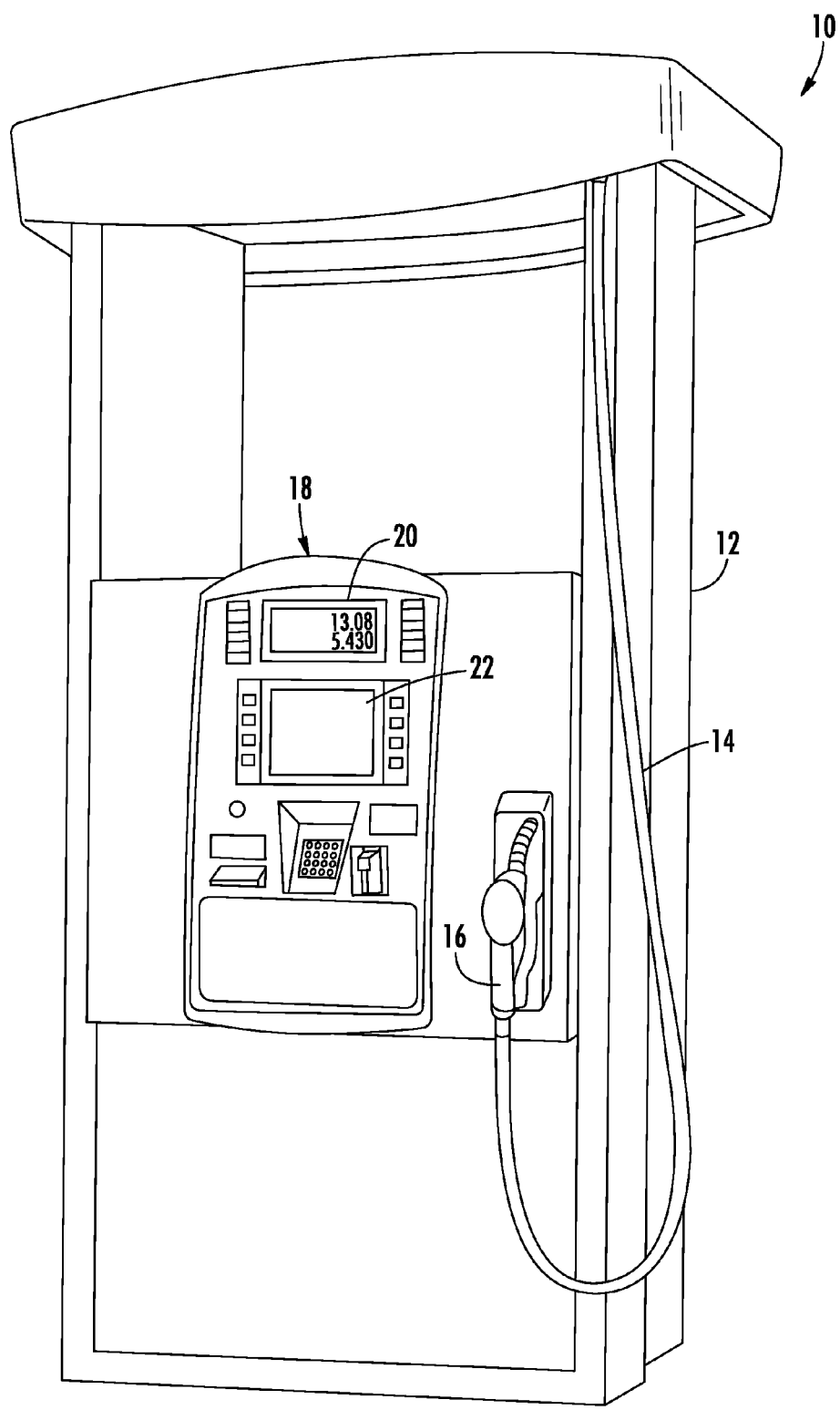
FIG. 1 is perspective view of an exemplary fuel dispenser which may be constructed in accordance with embodiments of the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

Aspects of the present invention relate to detection and prevention of fraud caused by tampering with a fuel dispenser fuel proportional control valve. The proportional valve is operated by a control system electrically connected to the valve coil circuit so as to control opening of the valve to allow flow of fuel. In proper operation, the valve coil is mounted in a predetermined location upon the armature of the proportional control valve. The drive circuit including the valve coil will exhibit certain electrical characteristics, when the valve coil is properly mounted with respect to the armature, that are different than electrical characteristic exhibited when the valve coil is removed (or if tampering has otherwise occurred).

For example, the inductance of the valve coil while properly mounted is typically higher than when the valve coil is removed. As such, it is possible in accordance with the present invention to determine when the valve coil has been removed by applying a known signal and measuring an electrical response in the drive circuit. The known response provides a characteristic "signature" against which the test response may be compared. Tampering (or malfunction) may be inferred if the test response differs from the signature by a certain amount (such as more than a negligible amount).

In one example, power is applied to the valve coil for a predetermined time period so that the valve coil current steadily increases. Power is then disconnected from the valve coil and the valve coil current decreases in a time-decaying fashion. A current detector measures the valve coil current on a real-time basis while power is applied and disconnected to the valve coil. The current detector provides the current measurements back to an electronic controller. The electronic controller then may determine whether the amplitude of the valve coil current measurements exceeds a predetermined threshold amplitude. If so, the electronic controller determines that the valve coil has been removed from the proportional control valve. Embodiments of the present invention are discussed in more detail below with regard to FIGS. 1-8.

Some embodiments of the present invention are particularly suitable for use with fuel dispensers in a retail service station environment, and the below discussion will describe preferred embodiments in that context. However, those of skill in the art will understand that the present invention is not so limited. In fact, it is contemplated that the present invention may be used in other situations to detect tampering or malfunction of a control valve.

FIG. 1 is a perspective view of an exemplary fuel dispenser 10 in which embodiments of the present invention may be used. For example, fuel dispenser 10 may be the ENCORE® fuel dispenser or the SK700 fuel dispenser, both sold by Gilbarco Veeder-Root. Those of skill in the art will appreciate, however, that the present invention may be used with proportional control valves in any fuel dispenser.

Fuel dispenser 10 includes a housing 12 with at least one flexible fuel hose 14 extending therefrom. Fuel hose 14 terminates in a manually-operated nozzle 16 adapted to be inserted into a fill neck of a vehicle's fuel tank. Various fuel handling components located inside of housing 12 allow fuel to be received from underground piping and delivered through hose 14 and nozzle 16 to a vehicle's tank, as is well understood.

The fuel dispenser 10 has a customer interface 18. Customer interface 18 may include a first display 20 that shows the amount of fuel dispensed and the price of the dispensed fuel. Further, customer interface 18 may include a second display 22 to provide instructions for basic transaction functions, such as initiating dispensing of fuel. The dispenser also preferably includes a credit card reader and a PIN pad to allow the customer to pay for the fuel at the dispenser using credit or debit cards.

Figure 2:
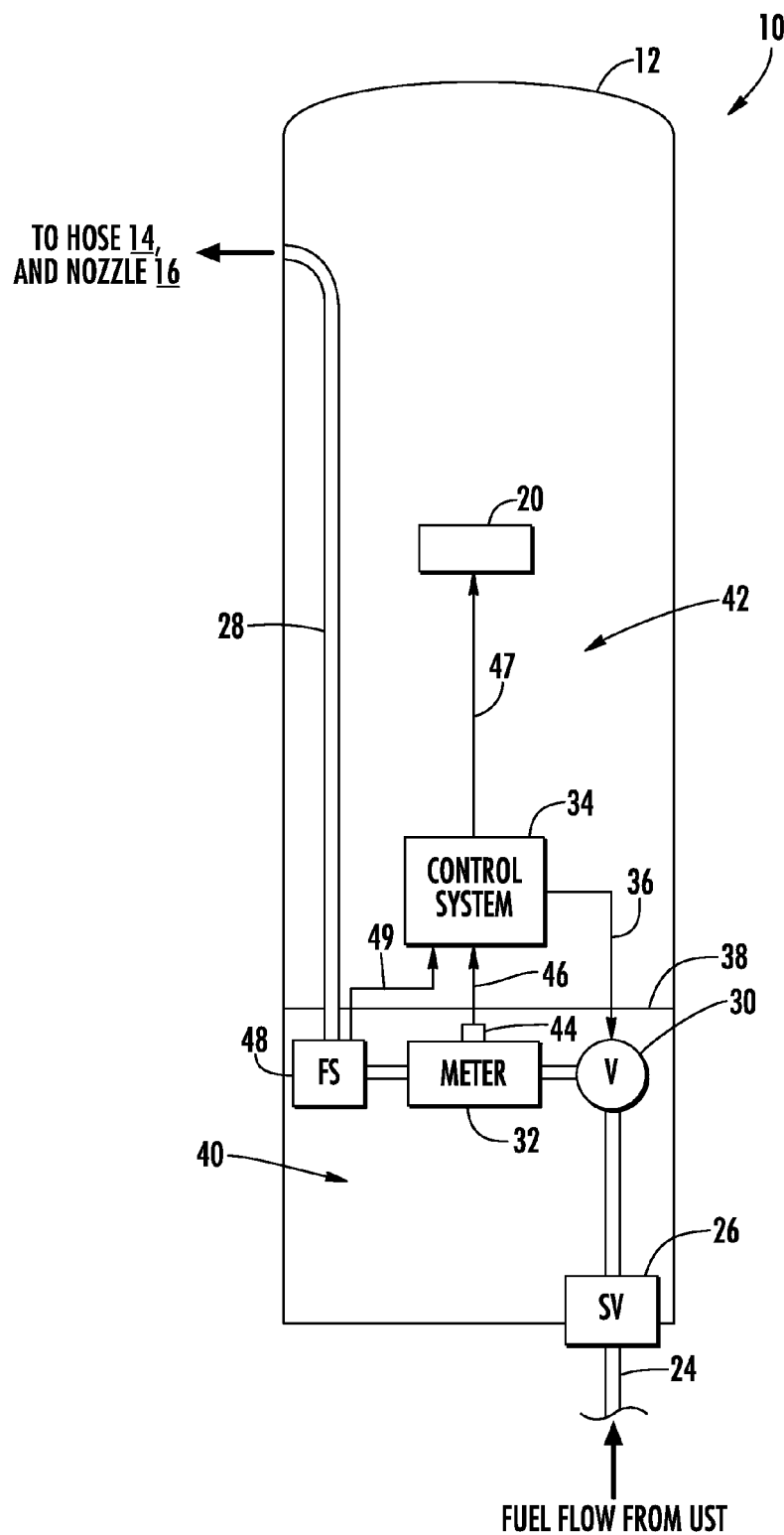
FIG. 2 is a schematic diagram of internal fuel flow components of the fuel dispenser of FIG. 1.

FIG. 2 is a schematic illustration of internal components of fuel dispenser 10. In general, fuel may travel from an underground storage tank (UST) via main fuel piping 24, which may be a double-walled pipe having secondary containment as is well known, to fuel dispenser 10 and nozzle 16 for delivery. An exemplary underground fuel delivery system is illustrated in U.S. Pat. No. 6,435,204 to White et al., hereby incorporated by reference in its entirety for all purposes. In many cases, a submersible turbine pump (STP) associated with the UST is used to pump fuel to the fuel dispenser 10. However, some fuel dispensers may be equipped with a pump and motor within housing 12 to draw fuel from the UST to the fuel dispenser 10.

Main fuel piping 24 may pass into housing 12 first through shear valve 26. As is well known, shear valve 26 is designed to close the fuel flow path in the event of an impact to fuel dispenser 10. U.S. Pat. No. 7,946,309 to Reid et al., hereby incorporated by reference in its entirety for all purposes, discloses an exemplary shear valve adapted for use in service station environments. Shear valve 26 contains an internal fuel flow path to carry fuel from main fuel piping 24 to internal fuel piping 28.

After fuel exits the outlet of the shear valve 26 and enters into the internal fuel piping 28, it may encounter a proportional control valve 30 positioned upstream of a flow meter 32. (In some fuel dispensers, valve 30 may be positioned downstream of the flow meter 32.) The term "proportional control valve" denotes any suitable device which includes a coil that converts electrical energy into a mechanical force acting upon a fluidic valve to accomplish gradated fuel flow, according to some embodiments. Proportional control valve 30 may be a proportional solenoid controlled valve, as described in U.S. Pat. No. 5,954,080 to Leatherman, hereby incorporated by reference in its entirety for all purposes. Moreover, while operation of a proportional control valve will be described herein, it will be appreciated that aspects of the present invention are applicable to various types of valves, not all of which are proportional valves.

Proportional control valve 30 is under control of a control system 34 via a control valve signal line 36. Control system 34 may be a microprocessor, microcontroller, or other suitable electronics with associated memory and software programs running thereon. In this manner, the control system 34 can control the degree of opening and closing of the proportional control valve via a valve coil (also referred to as "solenoid") to either allow fuel to flow or not flow through meter 32 and on to hose 14 and nozzle 16. Preferably, a main feedback control loop adjusts the programmed or set coil current to achieve the desired flow-rate, while a second feedback control loop adjusts and maintains the coil current to the "set" current value. According to one embodiment, proportional control valve 30 may be driven by a pulse-width modulation technique at a frequency based on the valve coil's inherent inductive time constant, such as 200 hertz for a period of 5 milliseconds.

Proportional control valve 30 is typically contained below a vapor barrier 38 delimiting a hydraulics compartment 40 of the fuel dispenser 10. The control system 34 is typically located in an electronics compartment 42 of fuel dispenser 10 above vapor barrier 38. The valve coil of control valve 30 may or may not be below the vapor barrier, depending on the construction of the fuel dispenser. In this embodiment, after fuel exits proportional control valve 30, it may flow through meter 32, which measures the volume and/or flow rate of the fuel. In other embodiments, control valve 30 will be located downstream of meter 32.

Flow meter 32 may be a positive displacement or inferential flow meter having one or more rotors which rotate on one or more shafts. Some examples of positive displacement flow meter technology which may be used with embodiments of the present invention are provided in U.S. Pat. No. 6,250,151 to Tingleff et al., U.S. Pat. No. 6,397,686 to Taivalkoski et al., and U.S. Pat. No. 5,447,062 to Köpl et al., each of which is hereby incorporated by reference in its entirety for all purposes. Likewise, examples of inferential flow meter technology which may be used with embodiments of the present invention are provided in U.S. Pat. No. 7,111,520 to Payne et al., U.S. Pat. No. 5,689,071 to Ruffner et al., and U.S. Pat. No. 8,096,446 to Carapelli, each of which is also incorporated by reference herein in their entireties for all purposes.

Meter 32 is operatively connected to a displacement sensor 44 that generates a signal indicative of the volumetric flow rate of fuel and periodically transmits the signal to control system 34 via a signal line 46. In this manner, the control system 34 can update the total gallons dispensed and the price of the fuel dispensed on display 20 via a communications line 47. In one embodiment, displacement sensor 44 may be a pulser. Those of ordinary skill in the art are familiar with pulsers that may be utilized with embodiments of the present invention. For example, displacement sensor 44 may be the T18350-G6 pulser offered by Gilbarco Inc. In other embodiments, however, displacement sensor 44 may be another suitable displacement sensor as described above. Reference is hereby made to U.S. Pat. No. 8,285,506 (the '506 patent), entitled "Fuel Dispenser Pulser Arrangement," filed Feb. 2, 2010, the entire disclosure of which is incorporated by reference herein for all purposes.

In this embodiment, as fuel leaves flow meter 32, it enters a flow switch 48. Flow switch 48, which preferably includes a one-way check valve that prevents back flow through fuel dispenser 10, provides a flow switch communication signal to control system 34 via the flow switch signal line 49. The flow switch communication signal indicates to control system 34 that fuel is actually flowing in the fuel delivery path and that subsequent signals from sensor 44 are due to actual fuel flow.

After the fuel leaves flow switch 48, it exits through internal fuel piping 28 to be delivered through fuel hose 14 and nozzle 16 for delivery to the customer's vehicle. Nozzle 16 includes a manually-actuated valve as is well-known in the art.

As noted above, a dishonest user may tamper with the proportional control valve in an attempt to produce an unauthorized flow of fuel. Preferred techniques for detecting such tampering will now be described with reference to FIGS. 3-8.

Figure 3:
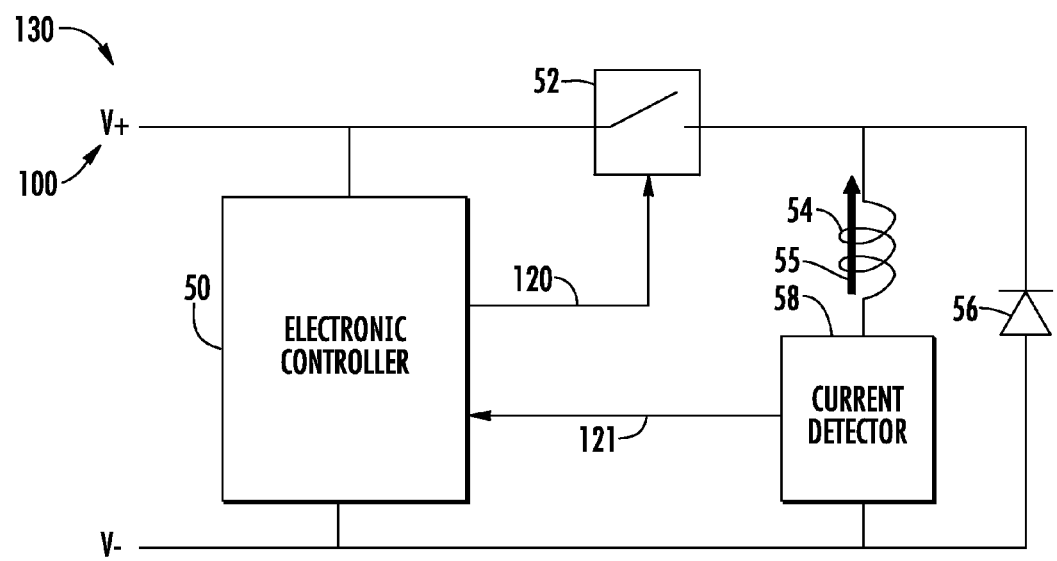
FIG. 3 is a diagrammatic representation of a tamper detection arrangement for a proportional control valve of a fuel dispenser constructed in accordance with an embodiment of the present invention.

FIG. 3 illustrates a tamper detection arrangement 130 in accordance with an embodiment of the present invention. In this embodiment, tamper detection arrangement 130 is operatively connected to proportional control valve 30. As shown, tamper detection arrangement 130 may include a power source 100, an electronic controller 50, a switch 52, a valve coil 54, a current detector 58, and a diode 56. Each of these exemplary components is discussed below. It will be appreciated that some or all of the components of tamper detection arrangement 130 may be integrated into valve 30, or into the housing of displacement sensor 44.

Switch 52, which may preferably be a suitable electronic switching element, is electrically connected in series between power source 100 and valve coil 54. Valve coil 54 is the solenoid of proportional control valve 30 and is mounted around the valve's armature 55. When switch 52 is opened, an open circuit exists between power source 100 and valve coil 54 so that power source 100 is disconnected from valve coil 54. Conversely, when switch 52 is closed, power source 100 is connected in series with valve coil 54. As discussed above, actuation of valve coil 54 produces a force acting on the armature 55 of valve 30 (and its associated fluidic valve member) to open the proportional control valve to allow fuel to be dispensed.

Controller 50 is configured to output a control signal 120 to electronic switch 52 to control the opening and closing of electronic switch 52. In this embodiment, control signal 120 may be either a high or low value, which may be determined by logic of electronic controller 50. For example, a high value may instruct switch 52 to close while a low value may instruct switch 52 to open. Electronic controller 50, which may be incorporated into or separate from control system 34, includes a processor, memory and suitable control logic.

The processor of electronic controller 50 may vary the level of control signal 120 in order to, for example, pulse width modulate the operation of valve 30. One skilled in the art will appreciate that there is a minimum modulation threshold at which the resulting amp-turns mechanical force will be insufficient to permit flow.

Tamper detection arrangement 130 further includes a current detector 58 electrically connected with valve coil 54. Current detector 58 measures instantaneous values of current flowing through valve coil 54 as a response to signal 120 closing switch 52. The current values thus measured are sent to electronic controller 50 as detection signals 121. It will be appreciated that the detection signals 121 will generally be digitized, either by controller 50 or using a separate analog-to-digital converter, for use by controller 50. Alternatively, various suitable analog techniques may also be used (e.g., integrators, comparators, etc.).

Protection diode 56, which is connected in parallel with valve coil 54, serves to inhibit undesired transient voltage spikes by preventing a sudden magnetic field collapse in valve coil 54 when switch 52 is opened. By delaying such magnetic field collapse, valve coil 54 retains energy within the magnetic field to generate a predictable time-decaying current through valve coil 54.

It should be understood that tamper detection arrangement 130 may include components other than those described above and thus, should not be limited to those illustrated in FIG. 3. For example, diode 56 may be replaced with another component which is configured to receive current generated from valve coil 54 when switch 52 is opened.

It should be further appreciated that valve 30 would generally include a suitable housing at which valve coil 54 is mounted. The housing provides physical support for valve coil 54 and maintains valve coil 54 in position while a moving force is imposed on the valve armature. However, if valve coil 54 is removed from, dislodged from or otherwise not properly mounted to the housing, valve coil 54 may not properly control the flow of fuel. In this regard, the unauthorized flow of fuel may result. Tamper detection arrangement 130 functions to detect whether valve 30 has been tampered with, such as if valve coil 54 has been removed from a housing of proportional control valve 30.

Figure 4:
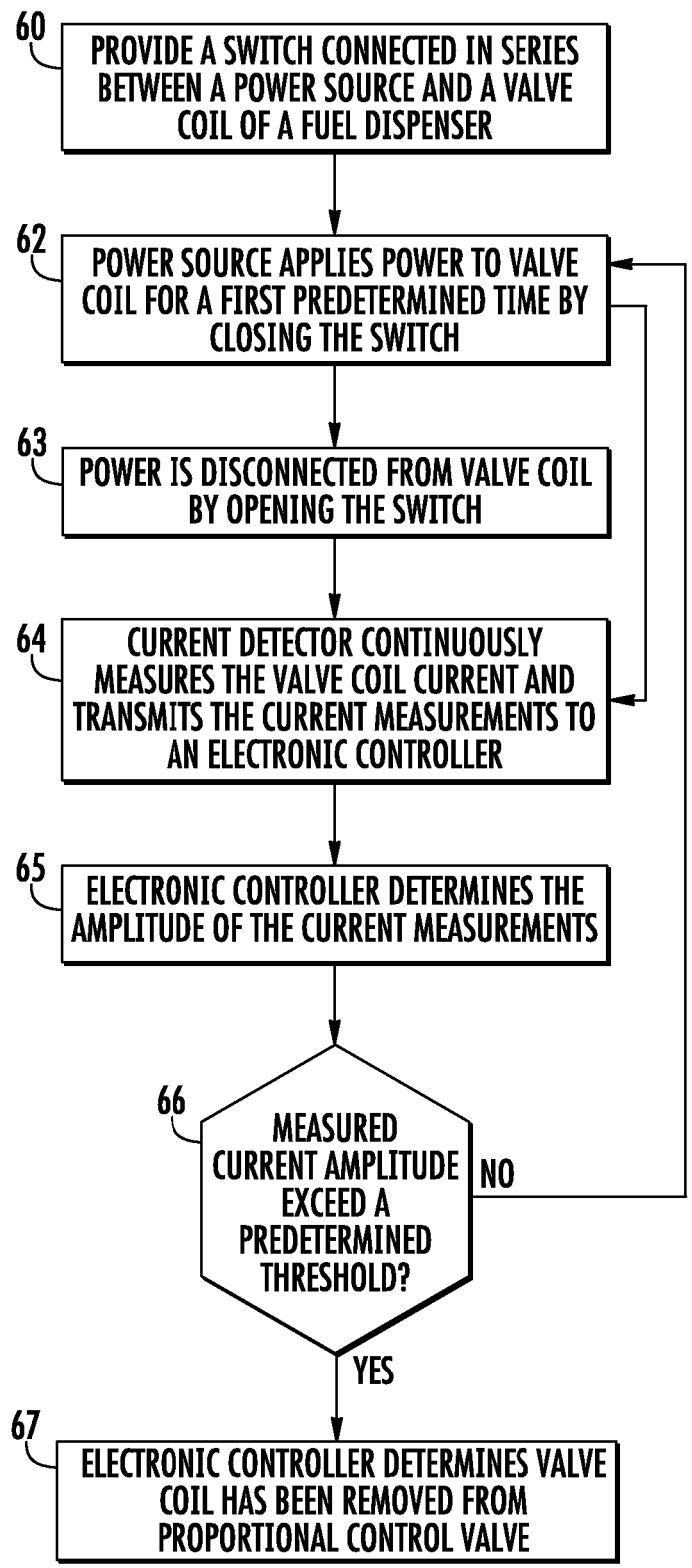
FIG. 4 illustrates a method of detecting whether a fuel dispenser has been tampered with in accordance with an embodiment of the present invention.

FIG. 4 illustrates a method of detecting tampering with valve 30 according to one embodiment. While describing the steps 60-67 of FIG. 4, reference is made to FIGS. 5-8.

Figure 5:
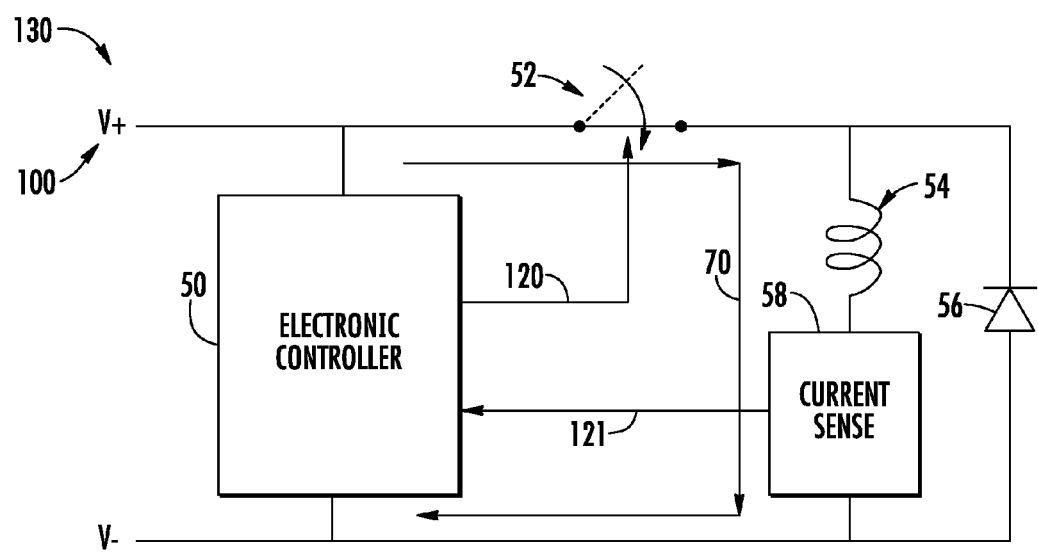
FIG. 5 illustrates a diagrammatic representation of the tamper detection arrangement of FIG. 3 with the switch closed in accordance with an embodiment of the present invention (but without showing the valve armature for the sake of simplicity).

As indicated at 60, tamper detection arrangement 130 includes switch 52. As noted above, switch 52 is electrically connected in series between power source 100 and valve coil 54 of a fuel dispenser, in a preferred embodiment. At step 62, power source 100 applies power to valve coil 54 via switch 52 for a first predetermined time 102. As illustrated in FIG. 5, electronic controller 50 closes switch 52 via output signal 120. For example, a "high" value (e.g., a DC voltage of 5 V) output signal may be used to close switch 52. As a result, current 70 flows from power source 100 through valve coil 54 and back to power source 100. While current 70 is flowing through valve coil 54, it is measured on an instantaneous basis by current detector 58. The current measurement 121 thus determined is provided to electronic controller 50 (step 64) via a suitable signal line.

Figure 7:
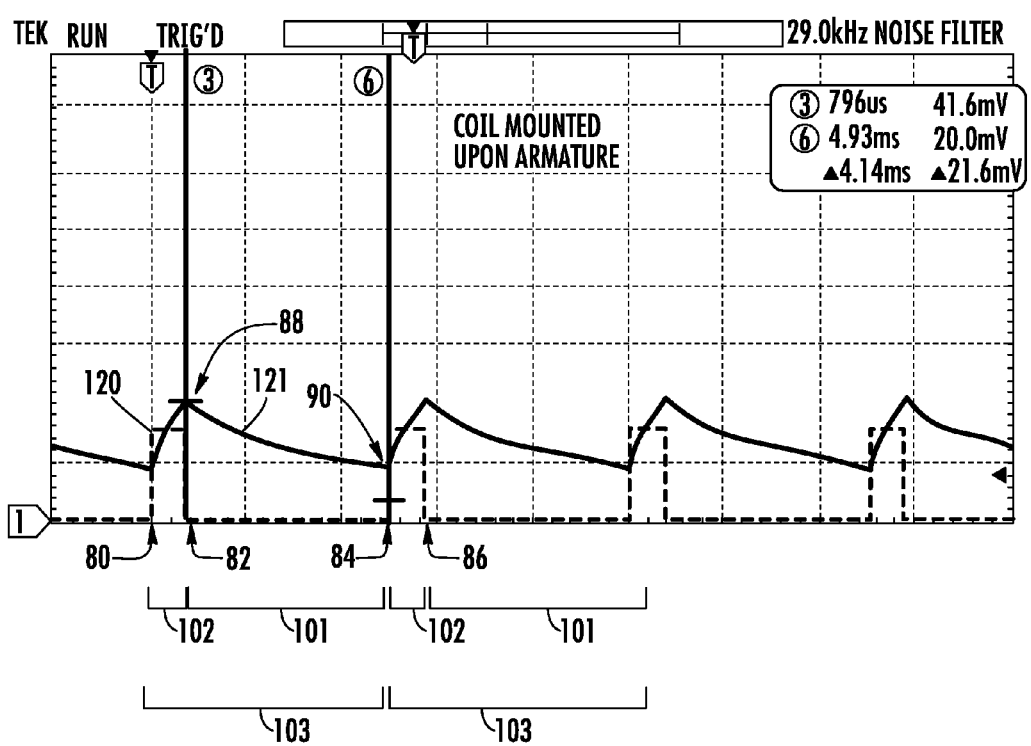
FIG. 7 depicts captured signals representative of a properly operational system in accordance with the present invention with valve actuation coil properly mounted upon the proportional valve's armature.

As illustrated in FIG. 7, the valve coil's current signal 121 steadily increases during time period 102 while power is applied to valve coil 54. In this regard, valve coil 54 stores energy due to the inductive properties of valve coil 54. Additionally, the application of current 70 through valve coil 54 generates a magnetic field which exerts a mechanical force of the valve's armature. The valve member then may move away from its seat to open a passageway to accomplish gradated fuel flow through the proportional control valve.

At step 63, after predetermined time period 102, power source 100 may be disconnected from valve coil 54. This may be accomplished by returning control signal 120 to a low value (e.g., 0 V). As a result, switch 52 will open such that power from power source 100 is no longer connected to valve coil 54.

Figure 6:
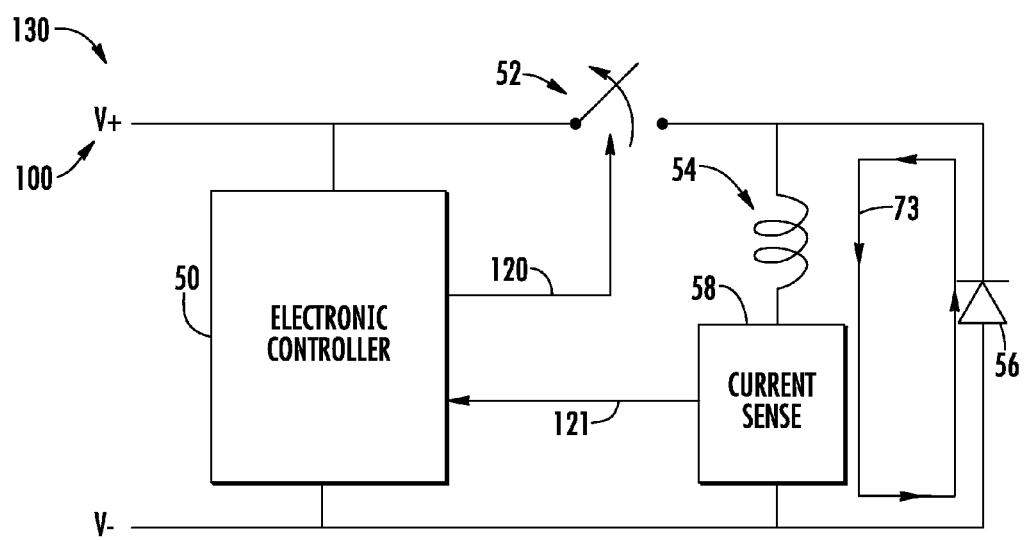
FIG. 6 illustrates a diagrammatic representation of the tamper detection arrangement of FIG. 3 with the switch re-opened in accordance with an embodiment of the present invention (but without showing the valve armature for the sake of simplicity).

When switch 52 opens, the energy stored due to the inductive properties of the coil will begin to be released. Accordingly, as illustrated in FIG. 6, valve coil 54 generates an inductive current 73. In this manner, current 73 flows from valve coil 54 through diode 56 and back to valve coil 54. As such, parallel diode 56 provides an alternate path for inductive current 73 to allow the stored inductor energy in valve coil 54 to dissipate over time. Moreover, since diode 56 is placed in parallel with valve coil 54, it prevents a transient voltage spike that may occur upon the opening of switch 52 from a closed state. Because the inductance of properly-mounted valve coil 54 is known, the energy of valve coil 54 is dissipated at a known rate, thereby creating a useful and predictable time-decaying current during the time interval after switch 52 is opened. As such, the amplitude of the valve coil current when opening and closing switch 52 is also known and can be used as the basis of a predetermined threshold.

During steps 62 and 63, current detector 58 may continuously measure the current through valve coil 54. For example, current detector 58 may continuously measure the valve coil current while power source 100 applies power to valve coil 54 and while the power is disconnected to valve coil 54 on a real-time basis. Examples of such current measurements are illustrated by the plots of signals 121 and 121' of FIGS. 7 and 8. Electronic controller 50 stores the current measurements in memory and analyzes the current measurements as discussed in steps 65-67.

Figure 8:
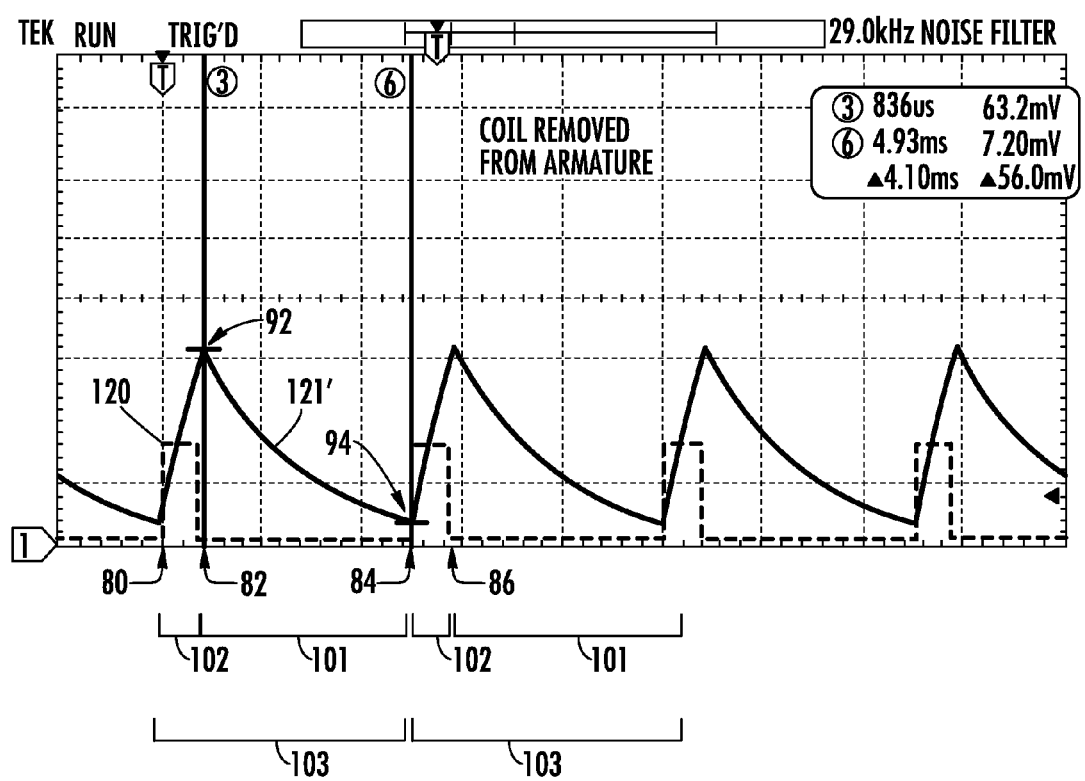
FIG. 8 depicts captured signals representative of a tampered system with valve actuation coil having been removed from the proportional valve's armature.

Referring now again to FIG. 7, an example is illustrated of control signal 120 outputted to switch 52 and a current signal 121 when valve coil 54 when it is properly mounted. FIG. 8 illustrates an example of control signal 120 and response signal 121' when valve coil 54 is removed (such as may occur by tampering). It is noted that control signal 120 of FIG. 7 is the same as that of FIG. 8 and is superimposed over signals 121 and 121' for ease of illustration. Signals 121 and 121' represent voltage charts from measuring the voltage across a fixed value resistor connected in series with the valve coil. Therefore, they show a direct correlation to the current flowing through the resistor and valve coil.

In both FIGS. 7 and 8, control signal 120 is a high value beginning at times 80 and 84 which closes switch 52 so that power source 100 applies power to valve coil 54. Signals 121 and 121' increase while switch 52 is closed, thereby indicating a charging of valve coil 54. At times 82 and 86, electronic controller 50 reduces the value of control signal 120 to a low or zero value, thereby re-opening switch 52. After times 82 and 86, signals 121 and 121' indicate that current 73 is dissipating from valve coil 54 in a time-decaying manner. The sequence from time 80 to time 84 (i.e., period 103) may continuously repeat such that at time 84, electronic controller 50 again increases control signal 120 to a high value, re-closing switch 52. After time period 102 (i.e., at time 86), switch 52 is again re-opened by bringing control signal 120 to a low value. Accordingly, the pulse width 102 and period 103 of signal 120 are the same for both FIGS. 7 and 8.

Referring back to FIG. 4, at step 65, electronic controller 50 determines the amplitude of the current measurements of valve coil 54. The amplitude may be calculated by determining the maximum and minimum values of signal 121, 121' during a single period 103. In FIG. 7, 88 indicates the maximum current of signal 121 and 90 indicates the minimum current of signal 121. In FIG. 8, 92 is the maximum current and 94 is the minimum current that occurs during a single period. The current amplitude of period 103 may be calculated by taking the difference between the maximum and minimum current measurements during that period. This provides the amount of current swing between when power is applied to valve coil 54 for a certain time period and after power has been disconnected from valve coil for another time period.

The amplitude of signal 121 may be calculated for multiple periods. For example, the amplitude of signal 121 may be calculated by averaging the amplitudes of each period. By way of another example, the amplitude of signal 121 may be calculated by averaging the current maximum for each period and subtracting an average of each current minimum for each period. Other methods for calculating the current amplitude are also possible and the above exemplary ways to calculate the current amplitude should not be limited. For example, while a dynamic (reactance) test is described, a DC resistance test may also provide satisfactory results.

At step 66, electronic controller 50 determines if the amplitude of signal 121 exceeds a predetermined threshold. Electronic controller 50 compares the amplitude of signal 121 with a predetermined threshold value to determine if the measured amplitude exceeds such threshold. For example, the predetermined threshold may be a value based upon or equal to a nominal value obtained by performing steps 62-65 when the valve coil 54 is known to be properly mounted to the proportional control valve housing and operating as intended. For example, the amplitude of signal 121 of FIG. 7 may be used as the predetermined threshold since the measurements of signal 121 were performed while valve coil 54 was properly mounted to the proportional control valve housing. In other cases, it may be desirable to provide a small offset above such nominal value to achieve the predetermined threshold. The predetermined threshold is calculated and stored in memory at electronic controller 50 (or some other device in communication with electronic controller 50). This predetermined amplitude threshold then is used as a baseline against which to compare future amplitude determinations to ascertain if there has been tampering with valve coil 54.

The predetermined amplitude threshold amount may be used as a triggering value because the current amplitude for valve coil 54 is generally greater when valve coil 54 is removed from the proportional control valve housing than when valve coil 54 is properly mounted. This is because the valve coil's inductance (e.g., 300 mH) is typically higher when a valve coil is properly mounted to the proportional control valve housing than the inductance value (e.g., less than 100 mH) when the valve coil is removed. As such, the disparate time-constants of the valve coil when properly mounted versus being removed are readily detected in the amplitudes in each situation when a low duty-cycle/narrow pulse drive is applied to valve coil 54. It should be understood that the duty cycle of signal 120 is the same in determining the predetermined threshold as determining whether valve coil 54 has been removed from the proportional control valve housing.

If the current amplitude exceeds the stored predetermined threshold, at step 67, electronic controller 50 determines that valve coil 54 has been removed from the proportional control valve housing; otherwise, the method may proceed back to step 62 to repeat the process. If the threshold is exceeded, electronic controller 50 may issue an alert or some sort of indication that tampering has occurred.

While switch 52 is illustrated as one way to apply power in an "on/off" manner to valve coil 54, it should be understood that other embodiments are also possible. For example, instead of employing switch 52, power source 100 may be connected directly to valve coil 54 and apply a time-variant current signal to valve coil 54. Examples of the time-variant current may include a square wave signal, a pulse wave signal, or any other means to apply current to valve coil 54.

Moreover, while the above example utilizes maximum current amplitude as an indicator of tampering, other electrical characteristics, such as back EMF diode characteristics and topologies, may also be utilized to determine tampering. It is also possible to limit the time duration of signal 120 such that insufficient amp-turns exist to actually open the valve. Such signals may nevertheless be of sufficient signal duration to perform an audit of proportional valve status (specifically, to detect valve coil removal in a continuous manner that is independent of pump authorization state or fuel flow status). Therefore, tamper detection can occur in the background continuously and without limitation of flow state. In other words, this allows checking for tampering during the time period when the control is not trying to cause fuel flow (which is most of the time). A constant check on the status of the valve coil and armature can thus be provided.

It will be appreciated that time and/or rate of coming up to a voltage and decay could be another measured data factor to determine tampering with the armature. For example, with the circuit arrangement depicted, one could, on closing the switch, measure the time for the current to rise to a certain level from some initial level prior to switch closure (typically, but not necessarily, zero), being a certain time for the coil on the valve and less for the coil off the valve. Similarly, one could measure the time for the current to decay to a certain level (relative or absolute) from some initial level prior to the switch opening, again being a certain time for the coil on the valve and less for the coil off the valve. While using a similar arrangement to energize the valve coil for normal operation, one might separately apply an AC signal of appropriate frequency and amplitude to the coil via some source resistance and measure the attenuation, which would be a certain value for the coil on the valve and greater for a coil off the valve.

While one or more preferred embodiments of the invention have been described above, it should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the scope and spirit thereof.

The invention claimed is:

1. A fuel dispenser tamper detection arrangement comprising:
a valve coil;
a power source;

a switch electrically connected in series with the valve coil and the power source;

a current detector electrically connected with the valve coil and operative to determine measurements that are indicative of instantaneous values of current flowing in the valve coil; and an electronic controller communicatively connected with the switch and the current detector, the electronic controller being operative to:

apply a first control signal to the switch to close the switch so that the power source applies power to the valve coil and thereafter apply a second control signal to the switch to open the switch so that the power source no longer applies power to the valve coil;

receive measurements from the current detector of current flowing in the valve coil after the switch is closed for a predetermined period of time and determine therefrom data indicative of a current amplitude;

perform a comparison of the data indicative of a current amplitude against predetermined criteria; and based on the comparison, determine whether tampering has occurred.

2. The arrangement of claim 1, wherein the second control signal comprises removal of the first control second.

3. The arrangement of claim 2, wherein the predetermined criteria is a predetermined threshold and the electronic controller is configured to determine whether the current measurements exceed the predetermined threshold.

4. The arrangement of claim 3, wherein the electronic controller is operative to:

determine the current amplitude by determining a difference between maximum and minimum current measurements over the predetermined period of time, and determine if the current amplitude exceeds the predetermined threshold.

5. The arrangement of claim 4, wherein the predetermined threshold is based upon an amplitude of current measured in the valve coil in the absence of tampering.

6. The arrangement of claim 1, further comprising a diode electrically connected in parallel with the valve coil and configured to receive current generated by the valve coil when the switch is opened.

7. The arrangement of claim 1, wherein the predetermined criteria comprises a predetermined threshold based on current measured in the valve coil in the absence of tampering.

8. The arrangement of claim 1, wherein the valve coil is a component of a proportional control valve configured to accomplish a gradated fuel flow.

9. The arrangement of claim 1, wherein the control signal is of insufficient duration to actuate an armature associated with said valve coil.

10. The arrangement of claim 1, wherein the control signal is of sufficient duration to actuate an armature associated with said valve coil.

11. A method for determining tampering of a fuel dispenser, the method comprising:

providing a switch electrically connected in series with a power source and a valve coil of a control valve of the fuel dispenser;

providing a current detector electrically connected with the valve coil and operative to determine measurements that are indicative of instantaneous values of current flowing in the valve coil;

applying a first control signal to the switch to close the switch so that the power source applies power to the valve coil and thereafter apply a second control signal to the switch to open the switch so that the power source no longer applies power to the valve coil;

receiving measurements from a current detector of current in the valve coil after the switch is closed for a predetermined period of time and determine therefrom data indicative of a current amplitude;

comparing the data indicative of a current amplitude against predetermined criteria; and determining whether tampering has occurred in response to the comparing step.

12. The method of claim 11, wherein the predetermined criteria is based upon an amount of current measured in the valve coil in the absence of tampering.

13. The method of claim 11, further comprising disallowing flow of fuel in the fuel dispenser in response to determining that tampering has occurred.

14. The method of claim 11, wherein the second control signal comprises removal of the first control signal.

15. The method of claim 14, wherein the predetermined criteria comprises a predetermined threshold.

16. The method of claim 15, further comprising determining that the control valve has been tampered with in response in response to the current measurements being less than or equal to the predetermined threshold.

17. The method of claim 11, wherein the first control signal is of insufficient duration to actuate an armature associated with said valve coil.

18. The method of claim 11, wherein the first control signal is of sufficient duration to actuate an armature associated with said valve coil.

* * * * *